United States Patent [19]

Toyoda

[11] Patent Number: 4,785,202
[45] Date of Patent: Nov. 15, 1988

[54] SEMICONDUCTOR INTEGRATED CIRCUIT DEVICE HAVING AN INTEGRALLY FORMED BYPASS CAPACITOR

[75] Inventor: Nobuyuki Toyoda, Yokohama, Japan

[73] Assignee: Kabushiki Kaisha Toshiba, Kawasaki, Japan

[21] Appl. No.: 34,948

[22] Filed: Apr. 6, 1987

[30] Foreign Application Priority Data

Apr. 15, 1986 [JP] Japan .................................. 61-86606

[51] Int. Cl.$^4$ .......................................... H03K 19/01
[52] U.S. Cl. .................................. 307/443; 307/246;
307/303; 307/446; 307/450; 333/240; 333/246;
357/51
[58] Field of Search .................... 307/200 B, 443, 446,
307/448, 450, 246, 570, 574, 581, 303; 333/24.6,
238, 246; 357/22, 41, 51

[56] References Cited

U.S. PATENT DOCUMENTS

| | | | |
|---|---|---|---|
| 3,784,937 | 1/1974 | Jackson et al. | 333/24 C X |
| 4,114,120 | 9/1978 | Lupter | 333/246 |
| 4,210,885 | 7/1980 | Ho | 333/238 |
| 4,558,235 | 12/1985 | White et al. | 307/443 X |
| 4,609,836 | 9/1986 | Koike | 307/450 X |
| 4,626,889 | 12/1986 | Yamamoto et al. | 357/51 X |
| 4,654,689 | 3/1987 | Fujii | 357/51 |
| 4,654,690 | 3/1987 | Okada et al. | 357/51 |
| 4,663,543 | 5/1987 | Sitch | 307/443 X |

OTHER PUBLICATIONS

1984 Ga As IC Symposium Abstract p. 11; "Capacitor Diode FET Logic (CDFL) circuit approach for Ga As IC's" R. C. Eden.

Primary Examiner—Stanley D. Miller
Assistant Examiner—D. R. Hudspeth
Attorney, Agent, or Firm—Oblon, Fisher, Spivak, McClelland & Maier

[57] ABSTRACT

A semiconductor integrated circuit device according to the present invention comprising an electric circuit formed in a semiconductor substrate, said circuit including first and second nodes between which a potential difference is provided, a wiring of a large ground capacitance connected to the first node, and a bypass capacitor connected to the second node, said wiring and bypass capacitor being of an integral structure prepared by laminating an upper conductor film pattern connected to the second node via an insulating film on a lower conductor film pattern connected to the first node. A MIM-structure in which a wiring and a bypass capacitor are made integral is employed in the semiconductor integrated circuit device of the present invention, making it possible to eliminate the large area required for forming the independent bypass capacitor. Also, the ratio of the ground capacitance of the wiring to the capacitance of the bypass capacitor is constant regardless of the change in the length of the wiring.

10 Claims, 3 Drawing Sheets

F I G. 1
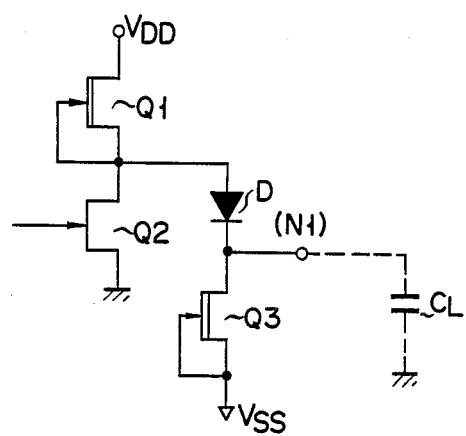
F I G. 2
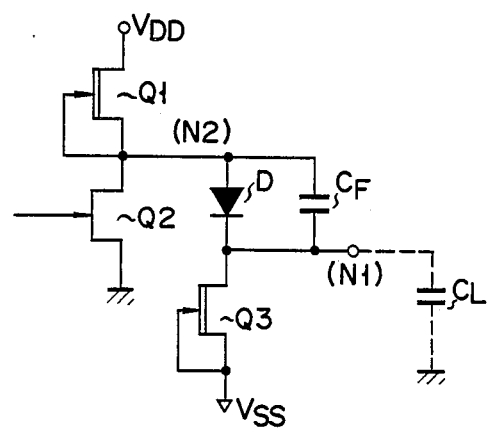

SEMICONDUCTOR INTEGRATED CIRCUIT DEVICE HAVING AN INTEGRALLY FORMED BYPASS CAPACITOR

BACKGROUND OF THE INVENTION

1. Field of the Invention

The present invention relates to a semiconductor integrated circuit device, and more particularly, to a semiconductor integrated circuit device provided with a wiring pattern having a long connecting distance.

2. Description of the Prior Art

Recently, semiconductor integrated circuits have been developed with increasingly higher integration densities. Nowadays, semiconductor integrated circuit devices are manufactured having hundreds of thousands of semiconductor elements formed in a single semiconductor chip. However, such a large scale integration gives rise to several problems with respect to the performance of the integrated circuit.

One of the problems is that the signal wiring connecting the semiconductor elements is usually quite long, leading to an increase in the propagation delay time of signal. When it comes to an integrated logic circuit comprising, for example, scores of thousands of logic gates, the average length of the wiring becomes as much as 2 to 3 mm, though the actual length depends on the type, design and manufacturing method of the integrated circuit. The long wiring causes an increase in the stray capacitance attributed to wiring, i.e., ground capacitance of wiring, with the result that the rise time and the fall time of a signal are prolonged, so as to make it difficult to achieve a high speed operation.

FIG. 1, which shows a part of an integrated circuit using GaAs, is intended to explain the problem noted above. As seen from the drawing, the circuit comprises metal-semiconductor type field effect transistors (MES-FET) Q1 to Q3. The transistor Q1 is of a normally on type, i.e., D-FET, and the transistor Q2 is of a normally off type, i.e., E-FET, so as to constitute an inverter, with the transistor Q1 acting as a load and the transistor Q2 as a driver. It is impossible to use MIS-FETs for forming the inverter because it is difficult to form a satisfactory gate insulating film in the case of using a GaAs substrate. The transistor Q3 is a D-FET acting as a current source. The circuit also comprises a Schottky barrier diode D acting as a level shifter. The diode D and transistor Q3 are intended to enable the inverter output voltage applied to a next gate from a node N1 to be controlled within a predetermined level. The particular construction for the level control, which is peculiar to a GaAs logic, is derived from the fact that a MES-FET is used as the transistor Q2 (E-FET) constituting the driver of the inverter. It should be noted that, in the case of a MES-FET, a leak current is likely to flow through its Shottky junction in accordance with an increase in the input voltage. To prevent the problem, it is necessary to control the output taken from the node N1, i.e., the input applied to the logic gate of the subsequent stage, to fall within a predetermined range.

If the wiring extending from the output node N1 to the gate of the subsequent stage is considerably long in the logic gate of the particular construction described above, the ground capacitance of the wiring becomes significantly large as if a large load capacitor $C_L$ of a large capacitance were connected to the node N1, as shown by an imaginary line in the drawing. It follows that it is necessary to perform the charging/discharging of the capacitor $C_L$ in the actual logic action, leading to a low response speed of the device. In order to improve the response speed, it is necessary to sufficiently increase the conductance of the load D-FET Q1, through which flows the charging current, and the current source D-FET Q3, through which flows the discharge current. However, the increase of the conductance noted above gives rise to another problem, i.e., increased power consumption.

A circuit as shown in FIG. 2 is known to the art as a measure for solving the above-noted problem. In the circuit shown in FIG. 2, a bypass capacitor $C_F$ is provided between the node N1 and a node N2 on the anode side of the Shottky diode D shown in FIG. 1. In this case, the charging current is applied to the load capacitor $C_L$ via the Schottky diode D and the bypass capacitor $C_F$. Also, the discharge current of the load capacitor $C_L$ flows through the D-FET Q3 acting as the current source and through the bypass capacitor $C_F$ into the E-FET Q2 acting as a driver of the inverter. It follows that it is possible to set the direct current of the source current D-FET Q3 to a small value, sufficient for only determining the bias point of the subsequent stage, by setting the impedance of the bypass capacitor $C_F$ with respect to the transient current to a sufficiently small value. As a result, the power consumption can be minimized and the logic action can be carried out at a sufficiently high speed. As a matter of fact, it is reported in "GaAs IC Symposium 1984", page 11, that, if the capacitance of the bypass capacitor $C_F$ is set 3 to 10 times as large as that of the load capacitor $C_L$ derived from the wiring, it is possible to perform a stable operation at a high speed.

The bypass capacitor $C_F$ shown in FIG. 2 includes a first type, which uses a Schottky diode and a second type, which uses a capacitor of a metal-insulator-metal laminated structure. The first type utilizes the capacitance generated when a reverse bias is applied to the Shottky diode. Where the wiring is long, leading to a large load capacitor $C_L$, however, a very large area is required for forming the bypass capacitor $C_F$ meeting the capacitance of the load capacitor $C_L$ in each of these two types. Naturally, the requirement of the large area makes it difficult to improve the integration density of the integrated circuit. In addition, where a number of wirings of different lengths are included as in a random logic, giving rise to a number of load capacitors $C_L$ of different capacitances, it is necessary to provide a number of bypass capacitors $C_F$ conforming with the load capacitors $C_L$. In this case, it is very difficult to design the layout of the circuit appropriately.

As described above, a long signal wiring has a detrimental effect on the circuit performance in a large scale integrated circuit. If a bypass capacitor is provided in an attempt to eliminate the defect, a large area is required for providing the bypass capacitor. In addition, the layout design is quite difficult.

SUMMARY OF THE INVENTION

An object of the present invention is to provide a semiconductor integrated circuit device provided with a bypass capacitor for eliminating the adverse effect caused by a long signal wiring included in a large scale integrated circuit. The device of the present invention makes it possible to overcome the defects accompanying the formation of the bypass capacitor, i.e., lowered integration density and difficulty in the layout design.

According to the present invention, there is provided a semiconductor integrated circuit device, comprising:

an electric circuit formed in a semiconductor substrate, said circuit including first and second nodes between which a potential difference is provided;

a wiring of a large ground capacitance connected to the first node; and a bypass capacitor connected to the second node; said wiring and bypass capacitor being of an integral structure prepared by laminating an upper conductor film pattern connected to the second node via an insulating film on a lower conductor film pattern connected to the first node.

A MIM-structure in which a wiring and a bypass capacitor are integrally formed is employed in the semiconductor integrated circuit device of the present invention, making it possible to eliminate the large area required in the conventional device for forming the independent bypass capacitor. Naturally, the chip area efficiency is prevented from being lowered in the present invention, in spite of the formation of the independent bypass capacitor. Also, the ratio of the ground capacitance of the wiring to the capacitance of the bypass capacitor is constant, regardless of the change in the length of the wiring. In addition, it is possible to control the capacitance of the bypass capacitor by properly selecting the material and thickness of the insulating film. It follows that it is possible to automatically determine the optimum ratio of the capacitance of the bypass capacitor to the ground capacitance of the wiring whatever size or shape the wiring has, so as to overcome the difficulty in the layout design.

BRIEF DESCRIPTION OF THE DRAWINGS

FIG. 1 exemplifies a GaAs logic gate;

FIG. 2 shows a modification of the GaAs logic gate shown in FIG. 1;

DETAILED DESCRIPTION OF THE PREFERRED EMBODIMENTS

Figure 3:
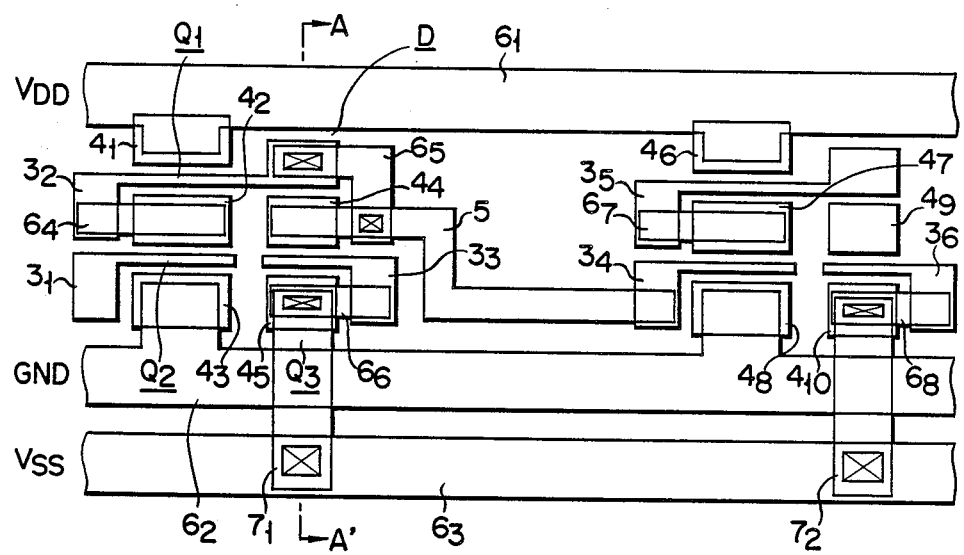
FIG. 3 shows a pattern layout of a GaAs integrated circuit according to one embodiment of the present invention.
Figure 4:
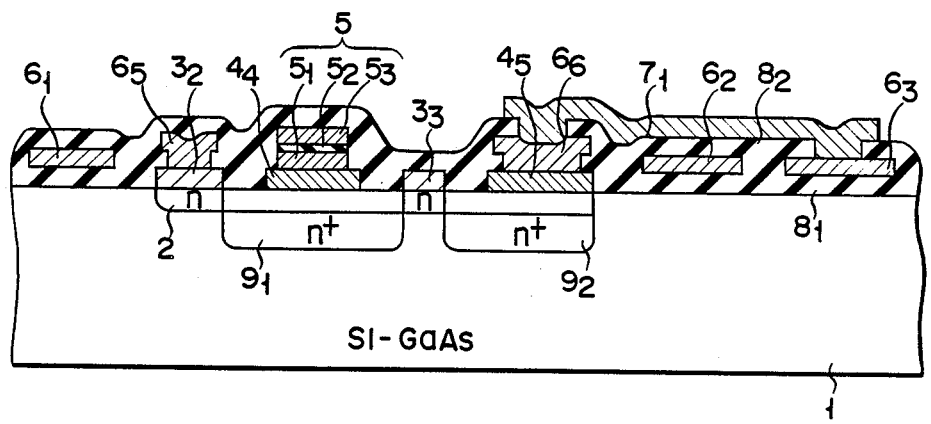
FIG. 4 is a cross-sectional view along line A—A' of FIG. 3.

FIGS. 3 and 4 collectively show a GaAs logic gate according to one embodiment of the present invention. The drawings cover the logic gate portion as shown in FIG. 2 and the logic gate portion of the next stage to which is supplied the output of the preceding logic gate. These logic gate portions are of the same construction. FETs Q1 to Q3 and a Schottky diode D shown in FIG. 3 correspond to those shown in FIG. 1. It should be noted that a wiring 5 extending from a node N1 on the cathode side of the Schottky diode D to the input terminal of the next stage is provided by a MIM wiring which is integral with a bypass capacitor.

In forming the particular structure, an n-type active layer 2 is formed on a surface region of a semi-insulating GaAs substrate 1 as seen from FIG. 4 by means of selective Si ion implantation under, for example, an accelerating energy of 50 KeV and a dose of $2.5 \times 10^{12}/cm^2$ for the E-FET portion and $3.5 \times 10^{11}/cm^2$ for the D-FET portion. Then, ohmic electrodes $4_1$, $4_2$, etc. consisting of AuGe/Au are formed, followed by forming Schottky gate electrodes $3_1$, $3_2$, etc., consisting of tungsten nitride. After formation of these electrodes, n+ layers $9_1$, $9_2$, etc. are formed by Si ion implantation in a high concentration so as to provide source and drain regions of D-FET and E-FET and to lower the resistance of the cathode of the Schottky diode, followed by forming a MIM wiring 5 connecting a node N2 on the cathode side of the Schottky diode D to the gate of the next stage. The MIM wiring 5 is of a laminate structure consisting of an Al film $5_1$, i.e., a lower conductor film, a SiO$_2$ insulating film $5_2$, and an Al upper conductor film $5_3$ For forming the MIM wiring 5, an Al film, a SiO$_2$ film and an Al film are deposited by sputtering in succession to form a laminate structure, followed by forming a photoresist pattern on the uppermost Al film. Then, the laminate structure is selectively etched by a reactive ion etching, with the photoresist pattern used as a mask. The MIM wiring 5 should be, for example, 2 microns wide, 3000 Å in the thickness of the Al films $5_1$, $5_3$, and 1000 Å thickness of the SiO$_2$ film $5_2$.

One end of the Al lower conductor film $5_1$ of MIM wiring 5 is in contact with a cathode electrode $4_4$, which also acts as the drain electrode of the current source D-FET Q3, of the Schottky diode D, with the other end being in contact with the gate electrode $3_4$ in the next stage logic gate. Thus, MIM wiring 5 functions substantially as a signal wiring. Also, MIM wiring 5, which is of a laminate structure of Al film $5_1$/SiO$_2$ film $5_2$/Al film $5_3$, acts as a capacitor equivalent to the bypass capacitor C$_F$ shown in FIG. 2.

After formation of MIM wiring 5, an interlayer insulating film $8_1$ is deposited, followed by making contact holes in the insulating film $8_1$ and subsequently forming Al wirings, i.e., V$_{DD}$ wiring $6_1$, ground wiring $6_2$, V$_{SS}$ wiring $6_3$, etc. The Al wirings also include a wiring $6_5$ for connecting the Al upper conductor film $5_3$ of MIM wiring 5 to the node N2 on the anode side of the Schottky diode D, i.e., the gate electrode $3_3$ of the D-FET. Then, an interlayer insulating film $8_2$ is deposited, followed by making contact holes in the insulating film $8_2$ and subsequently forming Al wirings $7_1$, $7_2$, etc. for connecting the source of the current source D-FET to the V$_{SS}$ wiring $6_3$, thereby producing a desired integrated circuit device.

Figure 5:
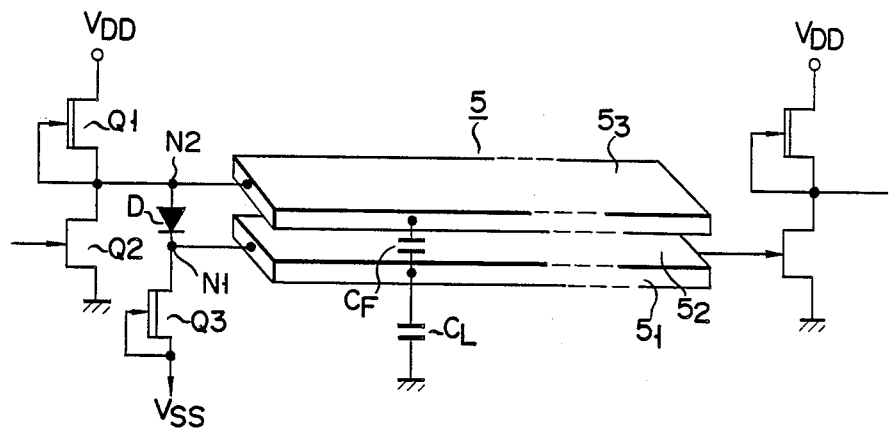
FIG. 5 shows an equivalent circuit of the embodiment shown in FIGS. 3 and 4.

FIG. 5 shows an equivalent circuit of the GaAs integrated circuit described above. As seen from the drawing, a bypass capacitor C$_F$ is provided by the MIM wiring 5 itself serving to connect two adjacent logic gates. In this embodiment, the interlayer capacitance C$_F$ per mm of MIM wiring 5 is about 600 fF and the capacitance C$_L$ relative to the ground is about 80 fF per mm of MIM wiring 5. It follows that the C$_F$/C$_L$ ratio is about 7.5. The GaAs logic was found capable of operation at a speed 1.6 times as high as the operation speed of the conventional GaAs logic which did not comprise the bypass capacitor C$_F$ under the same power consumption (V$_{DD}$=1.5 V; V$_{SS}$=−1.0 V; power consumption was about 0.8 mW/gate). In order to achieve such a high-speed operation, it is desirable to set the C$_F$/C$_L$ ratio at 5 or more, preferably, at 6 or more.

A GaAs integrated circuit is particularly advantageous in terms of the capacitance ratio noted above. Specifically, a semi-insulating substrate is used in a GaAs integrated circuit, resulting in a small earth capacitance C$_L$ of the wiring. Thus, the desired value of the capacitance ratio C$_F$/C$_L$ noted above can be obtained without significantly increasing the capacitance $C_F$. It follows that the insulating film $5_2$ of MIM wiring 5 can be easily formed in a practical thickness. When it comes to a Si integrated circuit using a conductive substrate such as a p-type or n-type substrate, the wiring has a large ground capacitance $C_L$, making it necessary to markedly increase the capacitance $C_F$ in order to obtain the desired value of the $C_F/C_L$ ratio in question. What should be noted is that it is necessary to make the insulating film $5_2$ of MIM wiring 5 markedly thin in order to increase the value of $C_F$ as desired. In this case, it is very difficult to manufacture the integrated circuit. Incidentally, an SOS-IC and an SOI-IC, in which the wiring has a small ground capacitance $C_F$, also produce the particular merits of a GaAs-IC described above.

Figure 6:
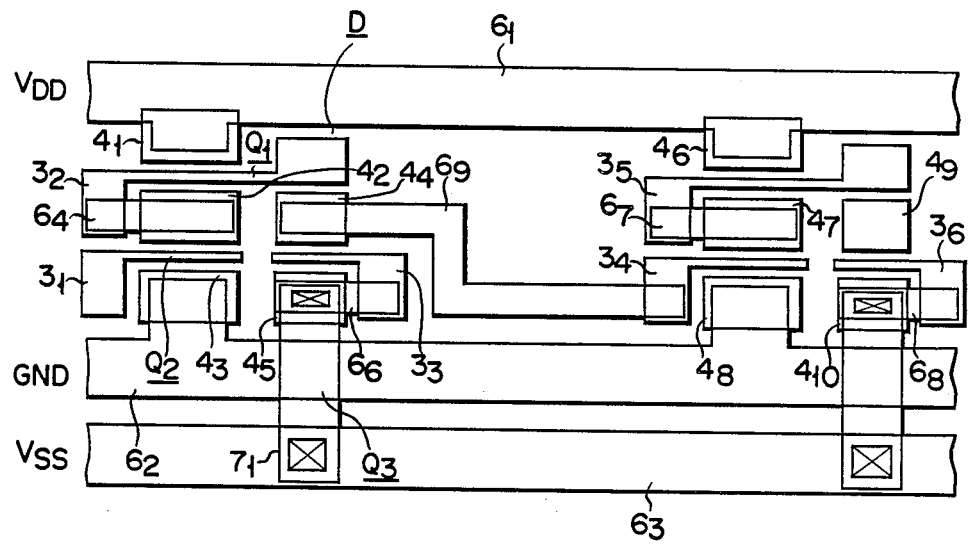
FIG. 6 shows a pattern layout for a conventional GaAs logic gate depicted in a manner to correspond to the pattern layout shown in FIG. 3.

In the embodiment described above, the bypass capacitor $C_F$ does not occupy a particular area, as apparent from FIG. 3. For comparison, FIG. 6 shows the pattern layout of a conventional GaAs-IC depicted in a manner to correspond to FIG. 3. The pattern layout of FIG. 6 is exactly equal to that shown in FIG. 3, except that, in FIG. 6, an ordinary A wiring $6_9$ acting as a signal wiring is formed in the portion of the MIM wiring 5 shown in FIG. 3. Naturally, a bypass capacitor is not provided in the device shown in FIG. 6. As is apparent from a comparison between FIGS. 3 and 6, the present invention makes it possible to employ the conventional pattern layout for forming a bypass capacitor without increasing the chip area.

What should also be noted is that, where a bypass capacitor is independently provided as in the prior art, it is necessary to determine the size of the bypass capacitor in accordance with the length of the individual wiring, which gives rise to the problem of the ground capacitance. However, the present invention permits overcoming this difficulty, because the capacitance of the bypass capacitor is increased in proportion to the increase in the length of the MIM wiring 5 in the present invention. Naturally, the layout design is markedly facilitated in the present invention.

The present invention is not restricted to the embodiment described above. For example, the MIM wiring is of Al/SiO$_2$/Al laminate structure in the embodiment described above. However, it is possible to use other materials for forming the MIM wiring. Also, the MIM wiring may be formed by a method other than the method described previously. For example, it is possible to pattern first the lower conductor film, followed by patterning the upper conductor film with an insulating film interposed therebetween, such that the upper conductor film is superposed on the lower conductor film.

The embodiment described above is directed to an inverter circuit. However, it is also possible to apply the technical idea of the present invention to other types of GaAs-IC such as BFL (Buffered FET Logic), SCFL (Source Coupled FET Logic), SDFL (Schottky Diode FET Logic) and DCFL (Direct Coupled FET Logic), with substantially the same effects. Further, the technical idea of the present invention is applied to a GaAs-IC in the embodiment described above. However, the technical idea of the present invention can also be applied to integrated circuits using other semiconductor materials such as Si.

We claim:

1. A semiconductor integrated circuit device, comprising:
   a logic circuit formed in a semiconductor substrate, said circuit including first and second nodes between which a potential difference is provided;
   a signal wiring of a large ground capacitance connected to the first node, the wiring supplying the output of a logic gate to the next stage logic gate; and
   a bypass capacitor connected to the second node;
   said wiring and bypass capacitor being of an integral structure prepared by laminating an upper conductor film pattern connected to the second node via an insulating film on a lower conductor film pattern connected to the first node.

2. The semiconductor integrated circuit device according to claim 1, wherein the other end of the lower conductor film pattern connected to the first node is connected to the input terminal of the next stage logic gate.

3. The semiconductor integrated circuit device according to claim 2, wherein the upper conductor film pattern is formed to cover the entire region of the lower conductor film pattern.

4. The semiconductor integrated circuit device according to claim 1, wherein the capacitance of the bypass capacitor connected to the second node is at least 5 times as large as that of the ground capacitance of the wiring connected to the first node.

5. A semiconductor integrated circuit device, comprising:
   a logic circuit formed in a semi-insulating GaAs substrate, said circuit including first and second nodes between which a potential difference is provided;
   a signal wiring of a large ground capacitance connected to the first node, the wiring supplying the output of a logic gate to the next stage logic gate; and
   a bypass capacitor connected to the second node;
   said wiring and bypass capacitor being of an integral structure prepared by laminating an upper conductor film pattern connected to the second node via an insulating film on a lower conductor film pattern connected to the first node.

6. The semiconductor integrated circuit device according to claim 5, wherein the outer end of the lower conductor film pattern connected to the first node is connected to the input terminal of the next stage logic gate.

7. The semiconductor integrated cicuit device according to claim 6, wherein the upper conductor film pattern is formed to cover the entire region of the lower conductor film pattern.

8. The semiconductor integrated circuit device according to claim 7, wherein the transistors constituting the electric circuit formed in the substrate are MESFETS.

9. The semiconductor integrated circuit device according to claim 5, wherein the first and second nodes are the cathode or anode of a Schottky diode provided for the level shifting purpose.

10. The semiconductor integrated circuit device according to claim 5, wherein the capacitance of the bypass capacitor connected to the second node is at least 5 times as large as that of the ground capacitance of the wiring connected to the first node.

* * * * *